(12) United States Patent
Sundaram

(10) Patent No.: US 10,187,982 B2
(45) Date of Patent: Jan. 22, 2019

(54) CIRCUIT BOARD STRUCTURES FOR THERMAL INSULATION AND METHOD OF MAKING SAME

(71) Applicant: Intel Corporation, Santa Clara, CA (US)

(72) Inventor: Arvind Sundaram, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/486,174

(22) Filed: Apr. 12, 2017

(65) Prior Publication Data
US 2018/0302984 A1    Oct. 18, 2018

(51) Int. Cl.
| H05K 7/00 | (2006.01) |
| H05K 1/05 | (2006.01) |
| H05K 3/44 | (2006.01) |
| H05K 3/30 | (2006.01) |
| H05K 1/18 | (2006.01) |
| G06F 1/16 | (2006.01) |

(52) U.S. Cl.
CPC ............ *H05K 1/05* (2013.01); *G06F 1/1626* (2013.01); *H05K 1/18* (2013.01); *H05K 3/30* (2013.01); *H05K 3/44* (2013.01)

(58) Field of Classification Search
CPC ....................................................... H05K 3/007
USPC ..................................................... 361/679.01
See application file for complete search history.

(56) References Cited

U.S. PATENT DOCUMENTS

| 2008/0248258 A1* | 10/2008 | Hao | ......................... B32B 15/08 428/172 |
| 2012/0228005 A1* | 9/2012 | Chisaka | ............... H05K 3/4691 174/250 |

\* cited by examiner

*Primary Examiner* — Jerry Wu
(74) *Attorney, Agent, or Firm* — Schwabe, Williamson & Wyatt, P.C.

(57) ABSTRACT

Techniques and mechanisms for providing thermal insulation with a circuit board. In an embodiment, a circuit board comprises a metal core and an electrical insulator disposed thereon. A first portion and a second portion each comprise at least five percent of the metal core by volume, wherein a first surface of the first portion is at a first level along a height axis, and a second surface of the second portion is at a second level along the height axis. A difference between the first level and the second level is less than, and at least twenty percent of, an overall thickness of the metal core. In another embodiment, the metal core further comprises a trench portion disposed between the first portion and the second portion, wherein a thickness of the trench portion is less each of the respective thicknesses of the first portion and the second portion.

4 Claims, 8 Drawing Sheets

CIRCUIT BOARD STRUCTURES FOR THERMAL INSULATION AND METHOD OF MAKING SAME

BACKGROUND

1. Technical Field

Embodiments of the present invention generally relate to circuit boards and more particularly, but not exclusively, to structures for limiting heat dissipation in a circuit board.

2. Background Art

Microprocessors and other electronic circuit components are becoming more and more powerful with increasing capabilities, resulting in increasing amounts of heat generated from these components. Packaged units and integrated circuit die sizes of these components are decreasing or remaining the same, which increases the amount of heat energy given off by the components for a given unit of surface area. Furthermore, as computer related equipment becomes more powerful, more and more components are being placed inside the equipment, which is also decreasing in size, resulting in additional heat generation in a smaller volume of space. Increased temperatures can potentially damage the components of the equipment, or reduce the lifetime of the individual components and the equipment. Therefore, large amounts of heat produced by many such integrated circuits must be dissipated, and therefore must be accounted for in designing the integrated circuit mounting and packaging devices.

As successive generations of integrated circuit systems continue to grow scale down in size, and increase in capability, there is expected to be an increasing premium placed on incremental improvements to the dissipation of heat by such systems.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously include techniques and mechanisms for providing thermal insulation with a metal core of a circuit board. In an embodiment, a metal core includes two or more portions which have different respective thicknesses and/or otherwise span different respective regions along a height dimension. A first portion and a second portion of a metal core may each comprise at least five percent (5%)—and in some embodiments, at least 10%—of the metal core by volume. A first surface of the first portion may be at a first height along the height dimension, wherein a second surface of the second portion is at a second height along the height dimension. In such an embodiment, a difference between the first height and the second height is at least twenty percent of an overall thickness of the metal core (where the difference is distinguished from—and less than—the overall thickness).

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including a circuit board having features described herein.

Figure 1:
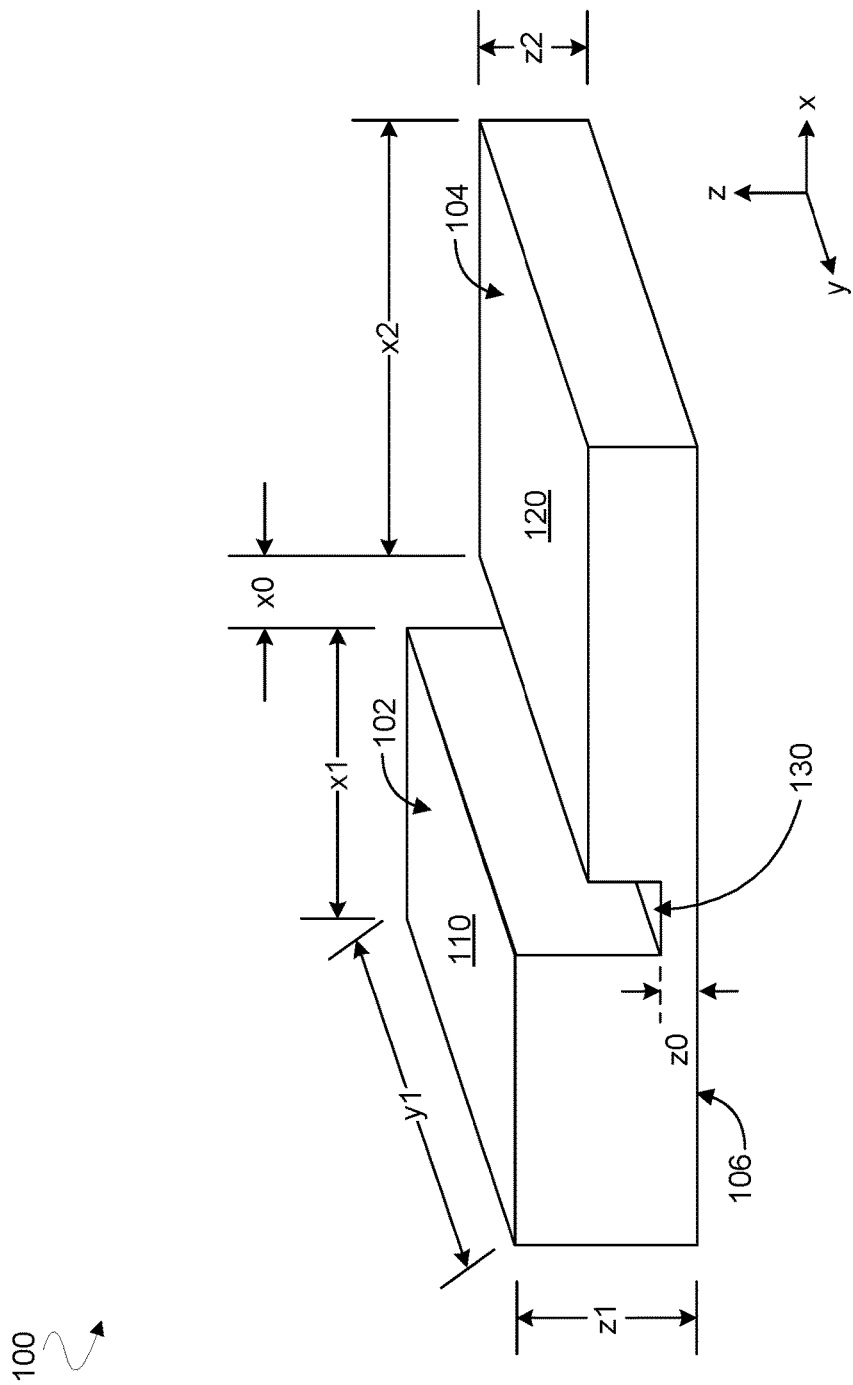
FIG. 1 is a perspective view of circuit board structures according to an embodiment.

FIG. 1 shows features of a metal core 100 to facilitate thermal insulation with a printed circuit board according to an embodiment. Structures of metal core 100 are not necessarily shown to scale or in relative proportion to one another. FIG. 1 illustrates one example of an embodiment wherein a metal core of a printed circuit board includes at least two portions, where respective surfaces of the portions extend in different planes—e.g., where a difference between the respective thicknesses of such portions is non-trivial (for example, not merely a result of manufacturing error). In providing portions that have different respective vertical spans, such a metal core may contribute to a difference in thermal conductivity characteristics between at least two regions of a printed circuit board.

Regarding physical structure of a metal core, "height" refers herein to a location or a structural dimension as determined with respect to a given line of direction, where—unless otherwise indicated—"area" refers to a span of a region (e.g., of a cross-sectional region or a surface region) in some plane which is orthogonal to that line of direction. That portion of the line of direction which is spanned by a given structure is referred to herein as the height (or alternatively, the "thickness") of that structure. A location at which a plane intersects such a line of direction, where the plane is orthogonal to that line of direction, is referred to herein as a height (or alternatively, "level") of that plane. A metal core may have one or more flat surfaces which extend each at a respective level along a height dimension. Unless otherwise indicated, "periphery" refers to an outermost edge of a given area.

With respect to metal core 100, "thickness" refers herein to any dimension measured in parallel to the z-axis of the xyz coordinate system shown. In one example embodiment, metal core 100 comprises at least two portions (e.g., including the illustrative first portion 110 and second portion 120 shown) which are each to provide a respective area on which circuit components may be variously disposed directly or indirectly. For example, first portion 110 and second portion 120 may each comprise at least five percent (5%)—and in some embodiments, at least 10%—of metal core 100 by volume.

To facilitate a variety of thermal conductivity characteristics, respective surfaces of first portion 110 and second portion 120 may extend at different respective heights along the z-axis—e.g., wherein, of first portion 110 and second portion 120, only a surface of one such portion extends in a given plane which is parallel to the x-y plane shown. For example, a surface 102 of first portion 110 and a surface 104 of second portion 120 may extend in planes at different respective levels. In such an embodiment, a difference between these levels may be at least 20%—and in some embodiments, at least 30%—of a maximum thickness of metal core 100 (i.e., where the difference is distinct from, and less than, the maximum thickness). By way of illustration and not limitation, the difference between such levels may be equal to an absolute difference value of $|(z1-z2)|$, where the maximum thickness of metal core 100 is equal to $z1$.

First portion 110 and second portion 120 may, in some embodiments, have different respective overall thicknesses as measured along the z-axis. For example, along a first periphery of first portion 110 (the first periphery spanning an area $x1 \square y1$), first portion 110 may have a first average thickness such as the illustrative thickness $z1$ shown—e.g., where along a second periphery of second portion 120 (e.g., the second periphery spanning an area $x2 \square y2$), second portion 120 has a second average thickness such as the illustrative thickness $z2$ shown. In such an embodiment, one of the first average thickness or the second average thickness may be at least two times the other of the first average thickness or the second average thickness. Although some embodiments are not limited in this regard, portions 110, 120 may have respective surfaces each extending in the same plane which is orthogonal to the height (z-axis) dimension. By way of illustration and not limitation, a surface 106 of metal core 100 may include both a bottom surface region of portion 110 and a bottom surface region of portion 120.

Although some embodiments are not limited in this regard, a first total area spanned by the first periphery of first portion 110 may be at least five percent (e.g., at least ten percent) of a largest cross-sectional area of the metal core. In such an embodiment, a second total area spanned by the second periphery of second portion 120 may be at least five percent (e.g., at least ten percent) of the largest cross-sectional area of the metal core. The largest cross-sectional area of the metal core may, for example, be equal to the product $[(x0+x1+x2) \square (y1)]$.

For any point along the periphery of first portion 110, the thickness of first portion 110 through that point may, for example, be within ten percent of the first average thickness $z1$. Alternatively or in addition, for any point along the periphery of second portion 120, the thickness of second portion 120 through that point may be within ten percent of the second average thickness $z2$. In some embodiments, at least one metal core portion (e.g., one of first portion 110 and second portion 120) forms a recess structure. Alternatively or in addition, an average thickness of all of first portion 110 may be at least two times an average thickness of all of second portion 120.

In some embodiments, metal core 100 may further comprise one or more other portions (such as the illustrative portion 130 shown) to facilitate improved thermal insulation in the printed circuit board. By way of illustration and not limitation, metal core 100 may further comprise a portion 130 disposed between portions 110, 120—e.g., wherein portion 130 has a length $x0$ and where an average height $z0$ of portion 130 is less than one of height $z1$ and height $z2$. For example, a difference between $z0$ and one of $z1$ or $z2$ may be at least 20%—and in some embodiments, at least 30%—of a maximum height of metal core 100. In such an embodiment, portion 130 may comprise at least 5% (for example, 10% or more) of metal core 100 by volume—e.g., where $z1$ is equal to $z2$, or where any difference between $z1$ and $z2$ is less than 20% of the maximum height of metal core 100. However, the particular number of such two or more metal core portions—and their particular configuration, dimensions, etc.—is merely illustrative. Metal core 100 may have more, fewer and/or differently configured portions to provide improved thermal insulation according to different embodiments. For example, metal 100 may omit portion 130 in other embodiments—e.g., wherein portions 110, 120 adjoin one another directly along the x-axis shown.

Metal core 100 may include copper, aluminum, brass and/or any of a variety of metals—e.g., including alloys—suitable for conducting heat (and, in some embodiments, to facilitate soldering and/or other electrical coupling). Formation of metal core 100 may include stamping, casting, cutting, grinding and/or other processes that, for example, are adapted from conventional techniques for forming metal core structures. In one example embodiment, an overall thickness (z-axis dimension) of metal core 100 is in a range of 0.15 millimeters (mm) to 0.6 mm—e.g., wherein an overall length (x-axis dimension) of metal core 100 is in a range of 10 mm to 30 mm and/or an overall width (y-axis dimension) of metal core 100 is in a range of 10 mm to 30 mm. However, such dimensions are merely illustrative, and may vary in different embodiments according to implementation-specific details.

Figure 2:
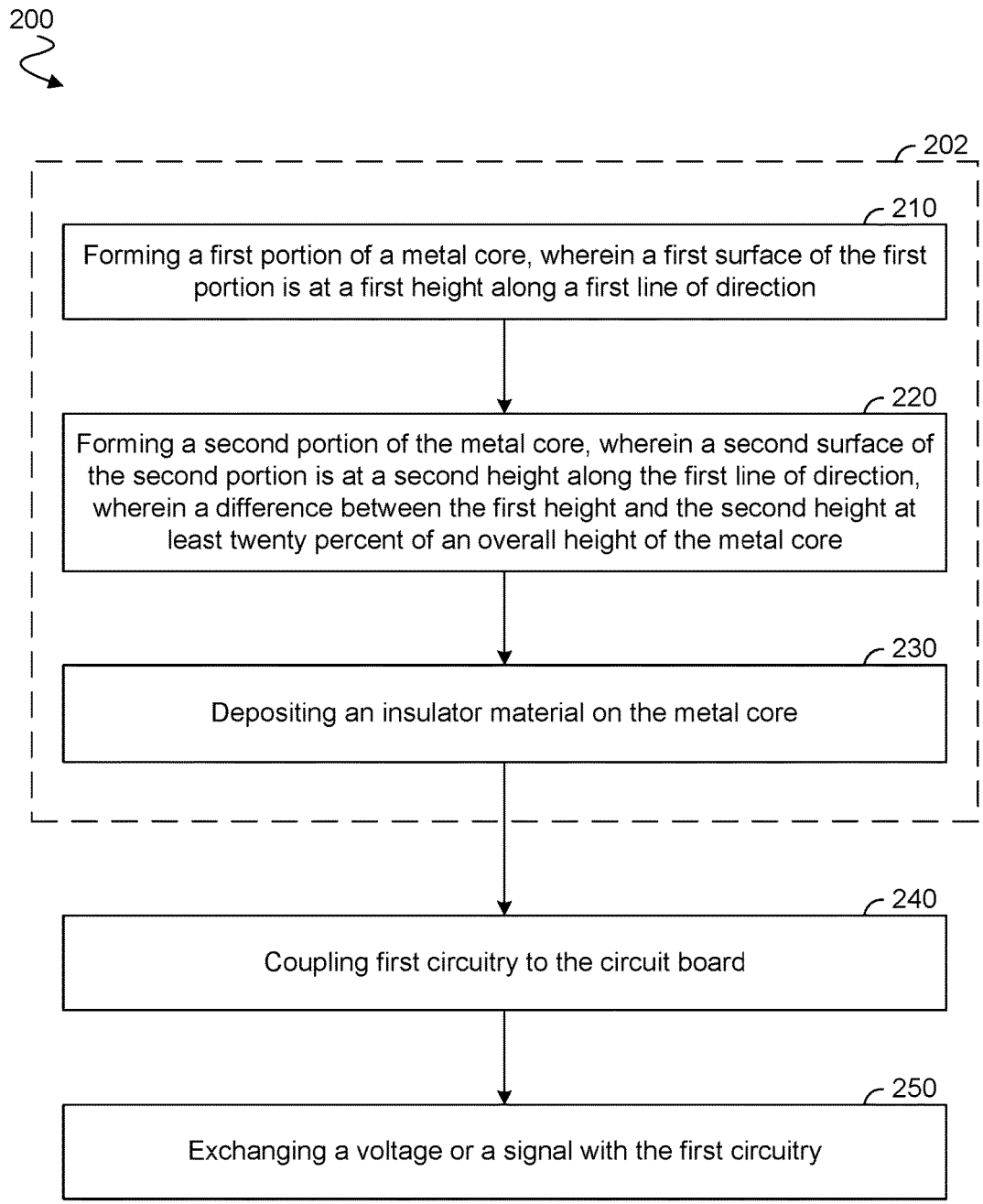
FIG. 2 is a flow diagram illustrating elements of a method to provide circuit board structures according to an embodiment.
Figure 4A:
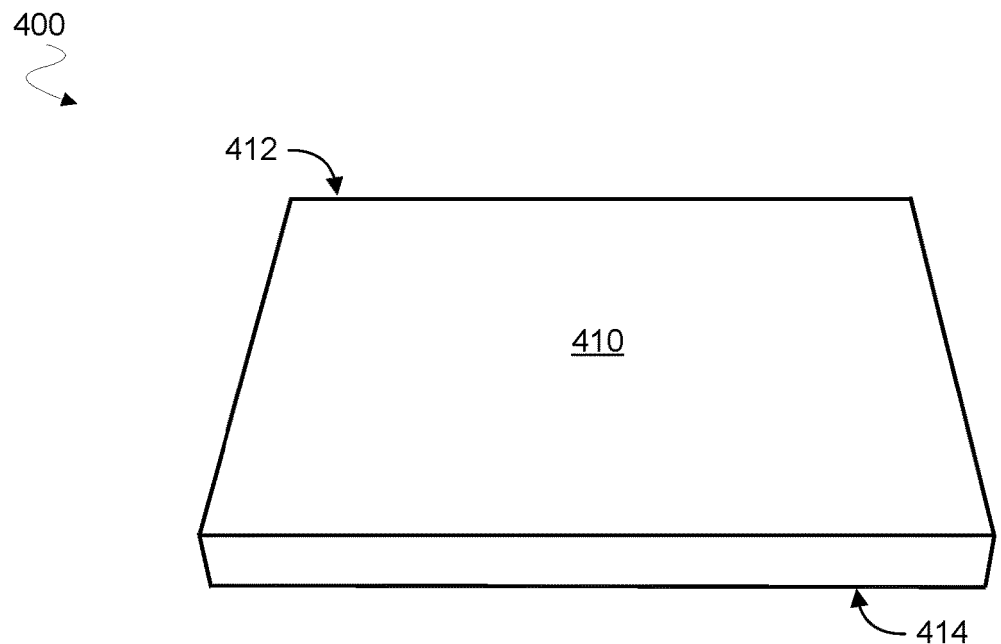
FIGS. 4A-4C show perspective views each illustrating respective structures during a corresponding stage of processing to circuit board structures according to an embodiment.
Figure 4A:
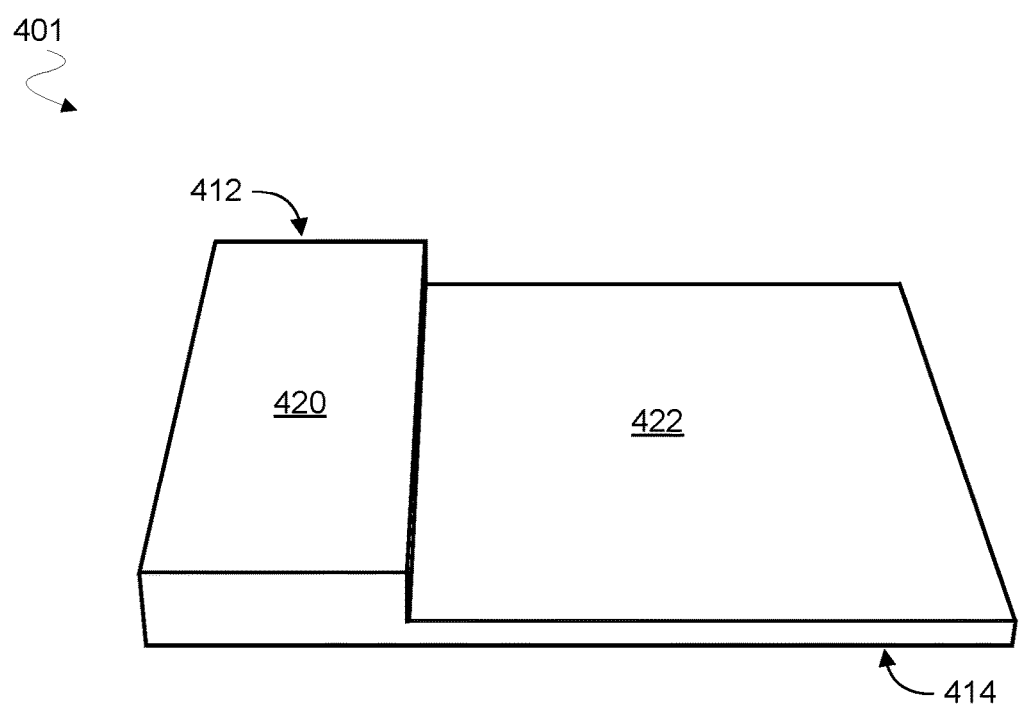
Figure 4B:
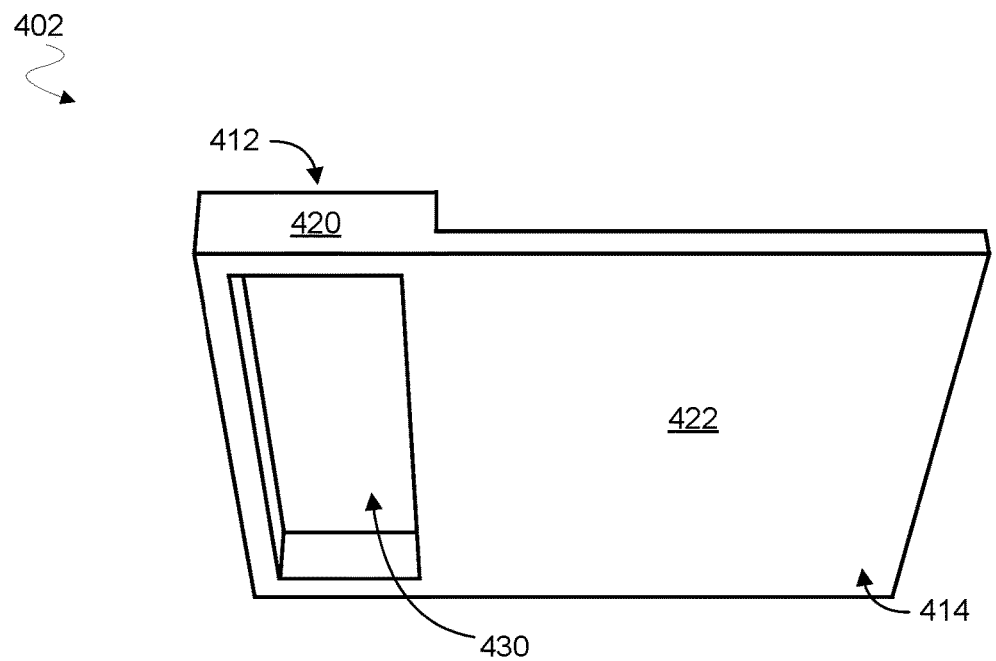
Figure 4B:
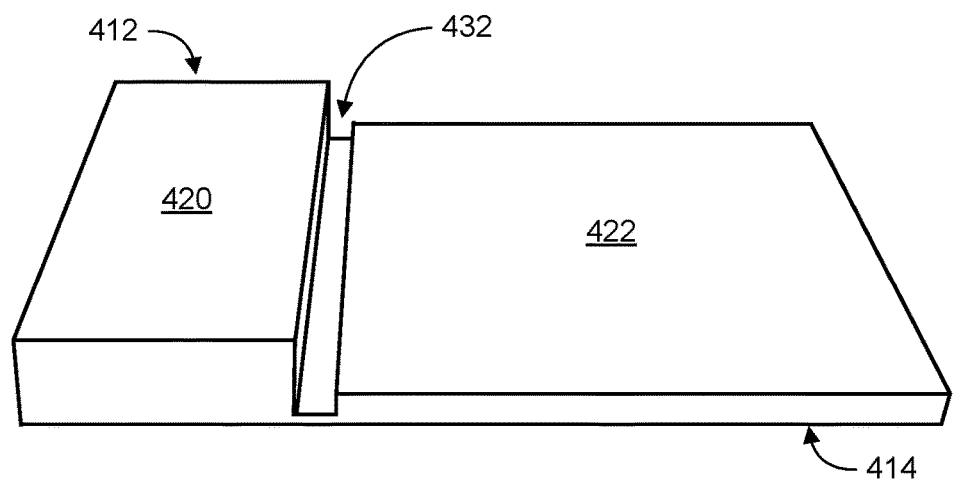

FIG. 2 shows features of a method 200 to provide thermal insulation properties of a circuit board according to an embodiment. Method 200 may be performed to manufacture and/or use structures of a printed circuit board, a metal core of which has some of all of the features of metal core 100, for example. Method 200 is described herein with respect to processing stages 400-405 which are variously shown in FIGS. 4A-4C. However, the description may be extended to apply to processing which fabricates any of various additional or alternative metal core structures having features described herein.

In one embodiment, method 200 includes operations 202 to fabricate a circuit board. Operations 202 may include, at 210, forming a first portion of a metal core, wherein a first surface of the first portion is at a first height along a first line of direction (along a z-axis, for example). By way of illustration and not limitation, the first portion 420 of a metal core may be formed at 210 from a conductive plate 410 which is shown at stage 400 in FIG. 4A, where plate 410 (e.g., including copper, aluminum, brass and/or the like) has surfaces 412, 414 on opposite sides thereof.

Operations 202 may further comprise, at 220, forming a second portion of the metal core, wherein the first portion and the second portion each comprise at least five percent of the metal core by volume. Referring again to FIG. 4A, a stamping, machining and/or other such processing of plate 410 may result, at stage 401, in the formation of a portion 420 and a portion 422. A second surface of the second portion formed at 220 may be at a second height along the first line of direction, wherein a difference between the first height and the second height is less than, and at least twenty percent of, an overall height of the metal core. For example, as shown at stage 401, the height of a top surface of portion 422 may be below the height of a top surface of portion 420. In some embodiments, such structures of a metal core may be formed by sintering of a powder or otherwise granular conductive material.

Operations 202 may, in some embodiments, include processing in addition to that shown, for example, by stages 400, 401. By way of illustration and not limitation, plate 410 may be further processed to form one or more recess structures each in a respective one of structures 420, 422. For example, as shown at stage 402 in FIG. 4B, portion 420 may be further stamped, machined and/or otherwise shaped to from a recess 430 which extends into side 414. Alternatively or in addition, plate 410 may be further processed to form one or more trench structures which are to provide at least partial thermal insulation between adjoining portions (e.g., between portions 420, 422). For example, as shown at stage 403 in FIG. 4B, plate 410 may be further stamped, etched, machined and/or otherwise shaped to from a trench portion 432 which extends between portions 420, 422 on side 412. In some embodiments, the metal core may have formed therein multiple recess portions and/or multiple trench portions. By way of illustration and not limitation, another recess portion 434 may be formed in portion 422 (as shown at stage 404 in FIG. 4C)—e.g., wherein recess portions 430, 432 are on opposite respective sides of the metal core. In some embodiments, two or more recess structures and/or two or more trench structures are all on the same side of a metal core.

Figure 3:
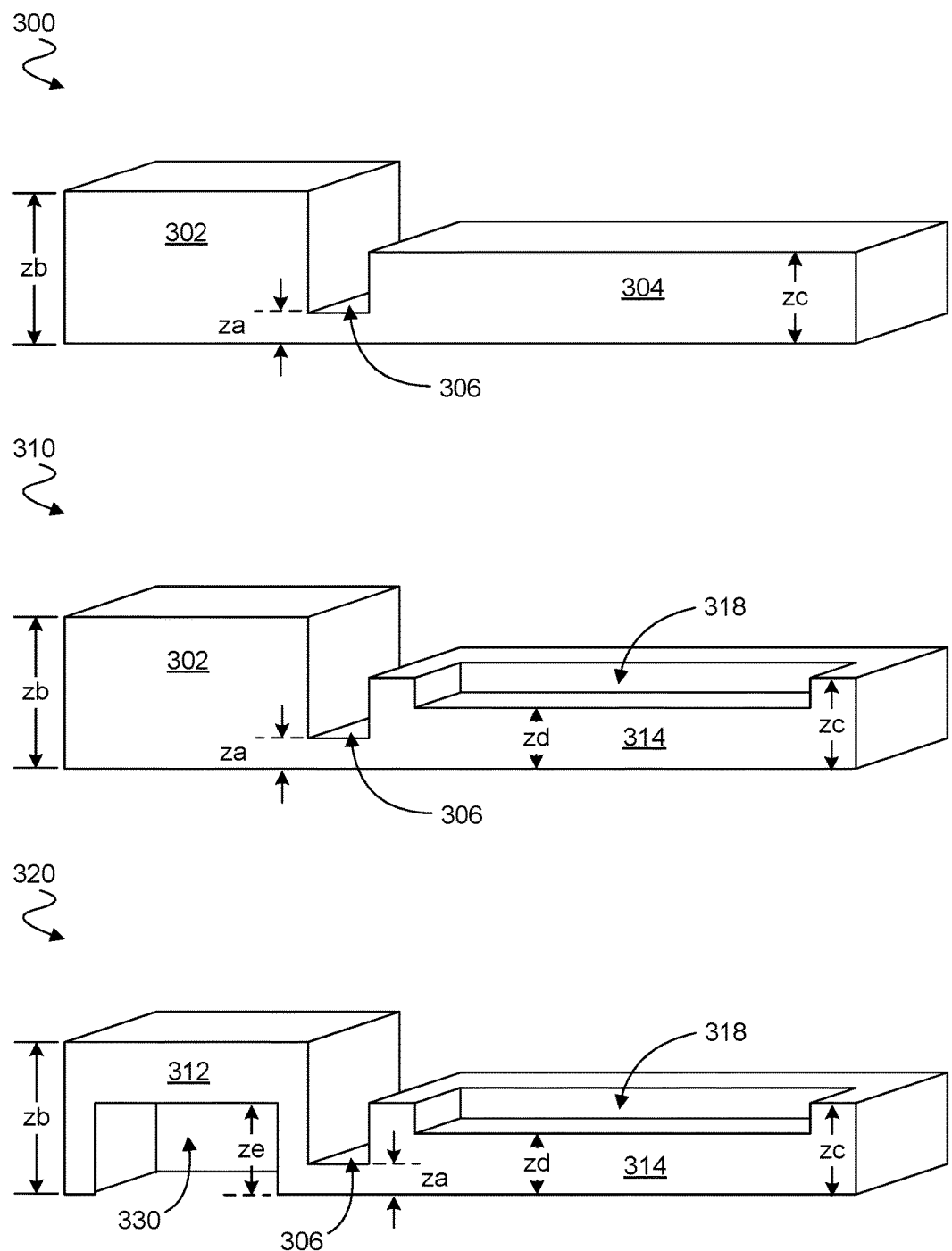
FIG. 3 shows cross-sectional diagrams each illustrating respective structures during a corresponding stage of processing to fabricate circuit board structures according to an embodiment.

FIG. 3 shows stages 300, 310, 320 of processing to form recess structures of a metal core according to one example embodiment. Stages 300, 310, 320 may represent processing similar to that of method 200 and/or that illustrated in stages 400-405, for example. In some embodiments, stages 300, 310, 320 provide further processing of metal core 100. At stage 300, a metal core 300 includes portions 302, 304 having respective thicknesses zb, zc—e.g., wherein another trench portion 306, disposed between portions 302, 304, has a thickness za which is less than each of zb and zc. In one example embodiment, thicknesses za, zb and zc are 0.15 mm, 0.65 mm and 0.4 mm, respectively. At stage 310, portion 304 may be stamped, machined and/or otherwise shaped into a portion 314 having a recess 318 formed therein. In one example embodiment, a bottom of recess 318 has a thickness zd which is 0.1 mm. At stage 320, portion 302 may be stamped, machined or otherwise shaped into a portion 312 having a recess 330 formed therein. Although some embodiments are not limited in this regard, recesses 318, 330 may be formed in opposite respective sides of the metal core. One or each of recesses 318, 330 may, for example, provide a respective reservoir for an adhesive, insulator, underfill and/or any of a variety of other materials used to facilitate the packaging of circuit components. In one example embodiment, a depth ze of recess 330 (the depth ze measured from the bottom side of the metal core) is 0.15 mm. However, the example dimensions of structures shown in stages 300, 310, 320 are merely illustrative of one embodiment, and may vary according to implementation specific details.

Referring again to method 200, in some embodiments, operations 202 further comprise, at 230, depositing an insulator material on the metal core—e.g., wherein the insulator material comprises FR-4, polyimide and/or any of a variety of other electrically insulative materials that, for example, are adapted from conventional circuit board fabrication techniques. Operations 202 may also include one or more additional processes (not shown) to facilitate interconnection of circuitry which is to be disposed in or on the printed circuit board. Such additional processes may include forming conductive traces in or on the insulator material.

Figure 4C:
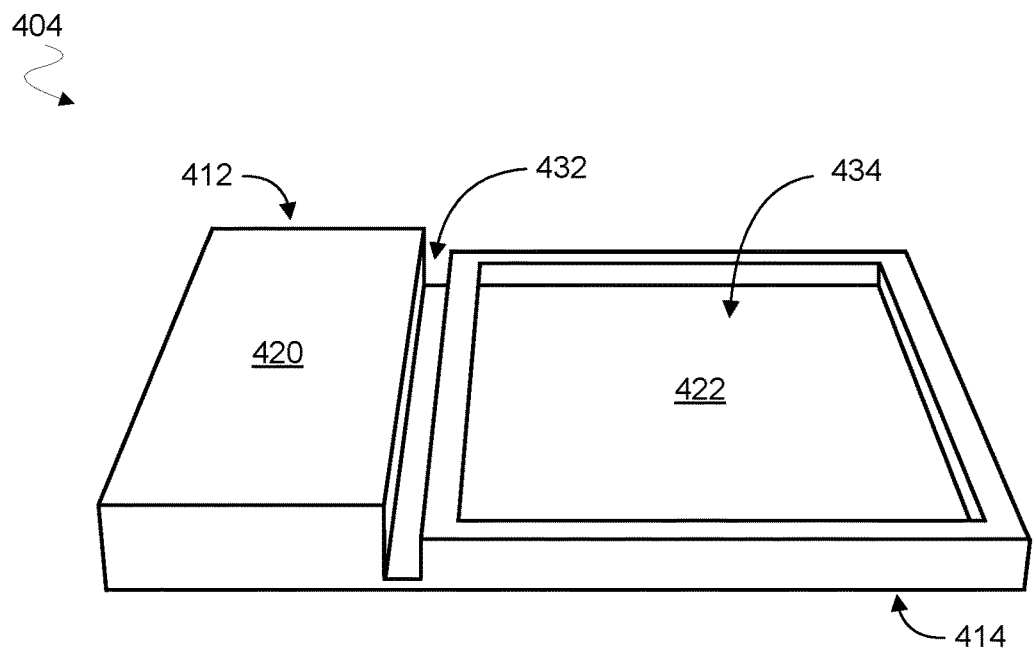
Figure 4C:
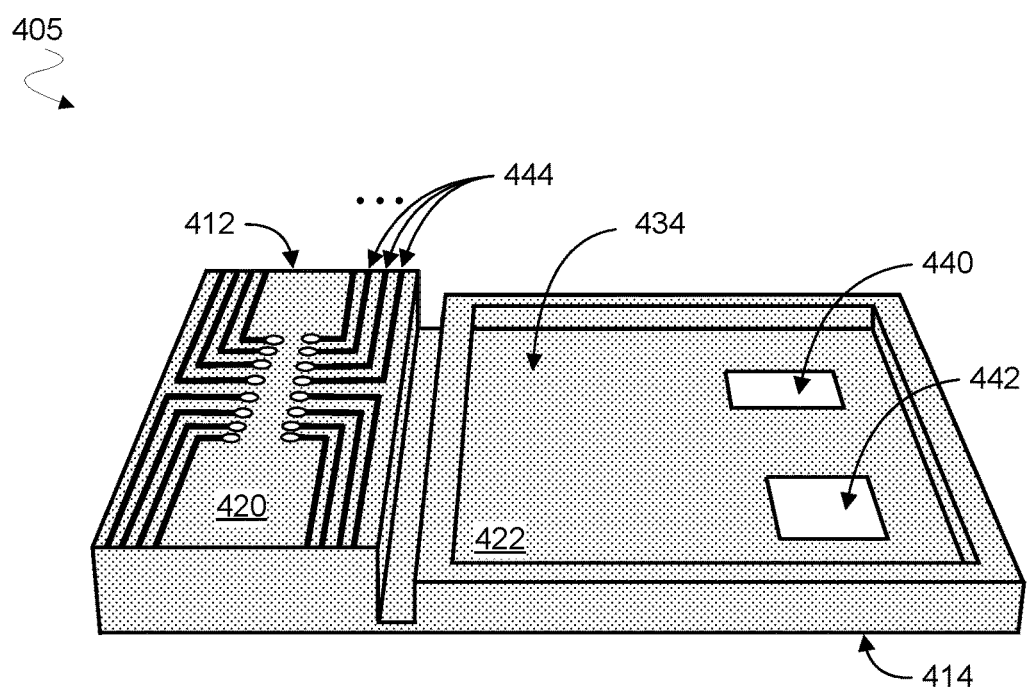

By way of illustration and not limitation, as illustrated in FIG. 4C by stage 405, the depositing at 230 may include performing a patterned deposition of an insulator on the metal core shown at stage 404. Such patterned deposition may leave on or more regions of the metal core exposed (e.g., such as the illustrative regions 440, 442 shown). Such regions 440, 442 may facilitate a soldering and/or other coupling of circuit structures to the metal core, where such coupling facilitates heat transfer to and/or from such circuit structures. The forming of conductive traces in or on the insulator material may, for example, include the formation of the illustrative traces 444 shown.

In some embodiments, method 200 may additionally or alternatively include one or more operations to avail of a circuit board such as one fabricated according to operations 202. For example, method 200 may include, at 240, coupling first circuitry to the circuit board and, at 250, exchanging a voltage or a signal with the first circuitry. The coupling at 240 may, in one embodiment, include directly coupling the first circuitry to the metal core—e.g., where the metal core is to function as a thermal sink into which heat from the first circuitry flows. The exchanging at 250 may include communicating the voltage or signal via a trace which extends within or on the insulator material deposited at 230.

Figure 5:
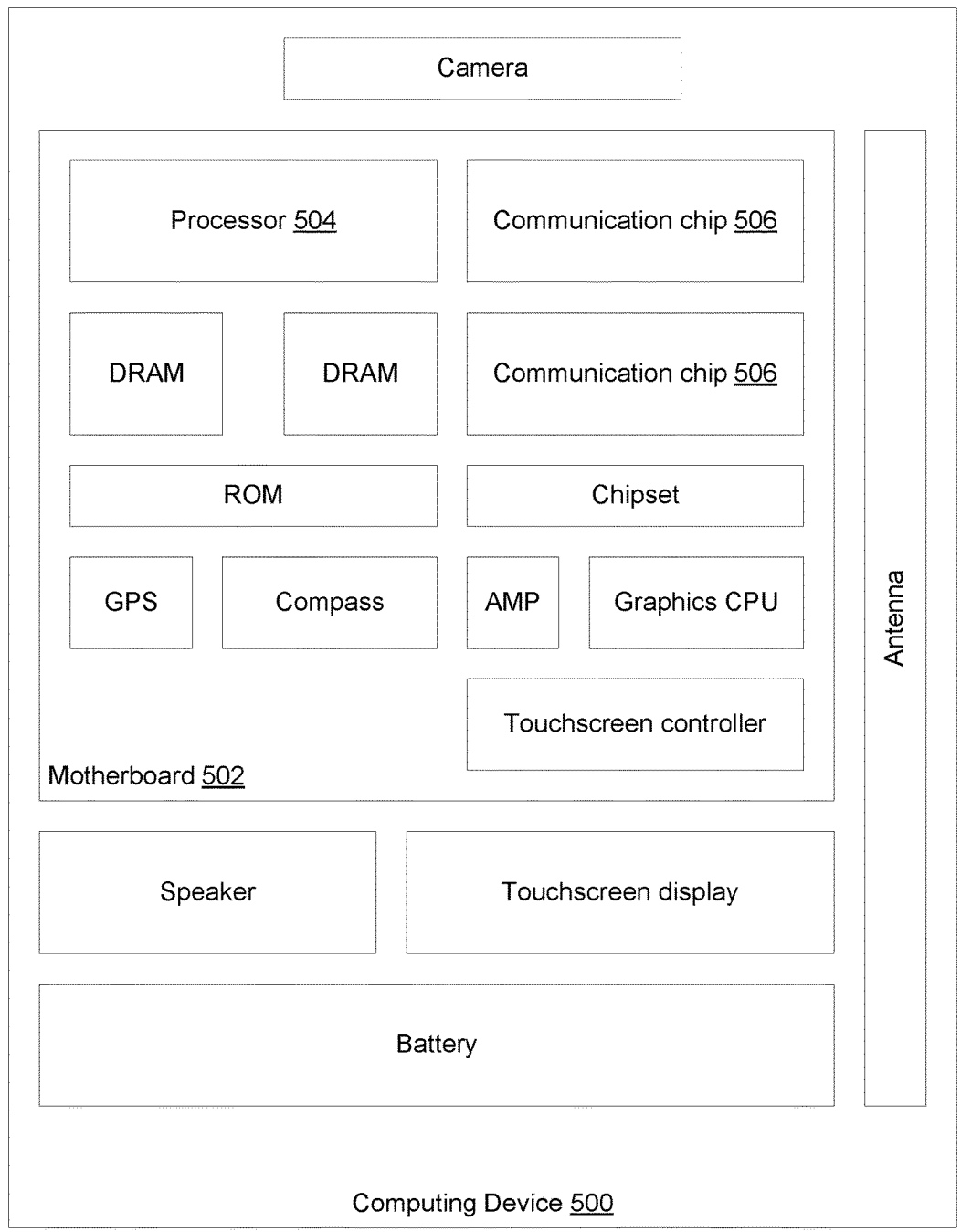
FIG. 5 is a functional block diagram illustrating elements of a computer device according to an embodiment.

FIG. 5 illustrates a computing device 500 in accordance with one embodiment. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. The term "processor" may refer to any device or portion of a device that processes electronic data from registers and/or memory to transform that electronic data into other electronic data that may be stored in registers and/or memory. The communication chip 506 also includes an integrated circuit die packaged within the communication chip 506.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 6:
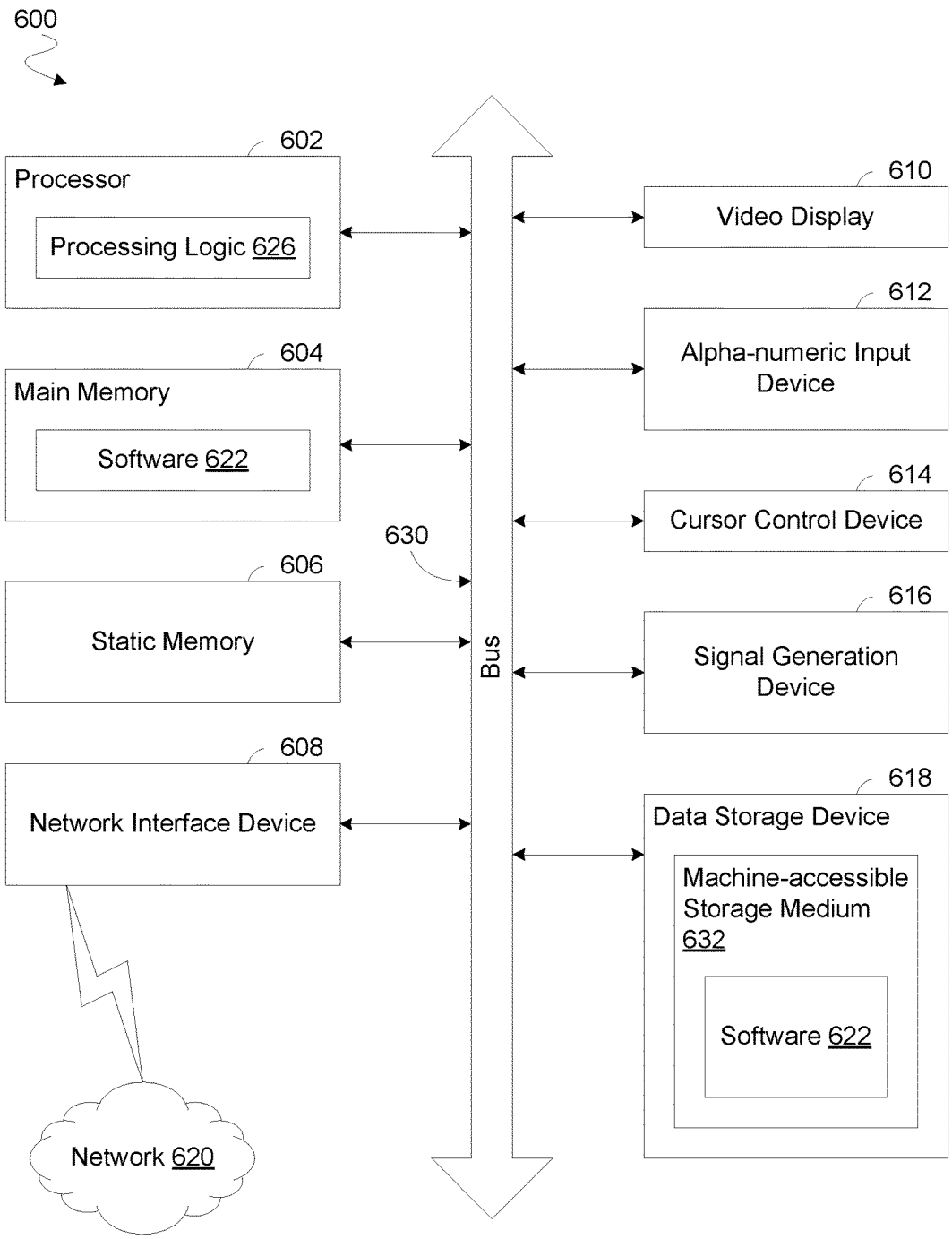
FIG. 6 is a functional block diagram illustrating elements of a computer system according to an embodiment.

FIG. 6 illustrates a diagrammatic representation of a machine in the exemplary form of a computer system 600 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations described herein.

The computer system 600 may further include a network interface device 608. The computer system 600 also may include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 632 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 632 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

In one implementation, a circuit board comprises a metal core including a first portion comprising at least five percent of the metal core by volume, wherein a first surface of the first portion is at a first height along a first line of direction, and a second portion comprising at least five percent of the metal core by volume, wherein a second surface of the second portion is at a second height along the first line of direction, wherein a difference between the first height and the second height is less than, and at least twenty percent of, an overall thickness of the metal core. The circuit board further comprises an insulator material disposed on the metal core.

In one embodiment, a first periphery of the first portion has a first average thickness along the first line of direction, wherein a second periphery of the second portion has a second average thickness along the first line of direction, wherein the first average thickness is at least two times the second average thickness. In another embodiment, for any point along the first periphery, the thickness of the first portion through the point is within ten percent of the first average thickness. In another embodiment, an average thickness of all of the first portion and is at least two times an average thickness of all of the second portion. In another embodiment, the metal core further comprises a trench portion disposed between the first portion and the second portion. In another embodiment, the first portion forms a first recess. In another embodiment, the second portion forms a second recess. In another embodiment, the first recess is formed in a first side of the metal core, wherein the second recess is formed in a second side of the metal core, the second side opposite the first side. In another embodiment, the first portion and the second portion each comprise at least twenty percent of the metal core by volume.

In another implementation, a method comprises fabricating a circuit board, including forming a first portion of the metal core, wherein a first surface of the first portion is at a first height along a first line of direction, and forming a second portion of the metal core, wherein the first portion and the second portion each comprise at least five percent of the metal core by volume, wherein a second surface of the second portion is at a second height along the first line of direction, wherein a difference between the first height and the second height is less than, and at least twenty percent of, an overall height of the metal core. The method further comprises depositing an insulator material on the metal core.

In one embodiment, a first periphery of the first portion has a first average thickness along the first line of direction, wherein a second periphery of the second portion has a second average thickness along the first line of direction, wherein the first average thickness is at least two times the second average thickness. In another embodiment, for any point along the first periphery, the thickness of the first portion through the point is within ten percent of the first average thickness. In another embodiment, an average thickness of all of the first portion and is at least two times an average thickness of all of the second portion. In another embodiment, the method further comprises forming a trench portion between the first portion and the second portion. In another embodiment, forming the first portion comprises forming a first recess of the first portion. In another embodiment, forming the second portion comprises forming a second recess of the second portion. In another embodiment, the first recess is formed in a first side of the metal core, wherein the second recess is formed in a second side of the metal core, the second side opposite the first side. In another embodiment, the first portion and the second portion each comprise at least twenty percent of the metal core by volume. In another embodiment, the method further comprises coupling first circuitry to the circuit board. In another embodiment, the method further comprises exchanging a voltage or a signal with the first circuitry.

In another implementation, a system comprises a circuit board including a metal core comprising a first portion comprising at least five percent of the metal core by volume, wherein a first surface of the first portion is at a first height along a first line of direction, and a second portion comprising at least five percent of the metal core by volume, wherein a second surface of the second portion is at a second height along the first line of direction, wherein a difference between the first height and the second height is less than, and at least twenty percent of, an overall thickness of the metal core. The circuit board further comprises an insulator material disposed on the metal core. The system further comprises integrated circuitry coupled to the circuit board, the integrated circuitry to communicate a signal via the circuit board, and a display device coupled to the integrated circuitry, the display device to display an image based on the signal.

In one embodiment, a first periphery of the first portion has a first average thickness along the first line of direction, wherein a second periphery of the second portion has a second average thickness along the first line of direction, wherein the first average thickness is at least two times the second average thickness. In another embodiment, for any point along the first periphery, the thickness of the first portion through the point is within ten percent of the first average thickness. In another embodiment, an average thickness of all of the first portion and is at least two times an average thickness of all of the second portion. In another embodiment, the metal core further comprises a trench portion disposed between the first portion and the second portion. In another embodiment, the first portion forms a first recess. In another embodiment, the second portion forms a second recess. In another embodiment, the first recess is formed in a first side of the metal core, wherein the second recess is formed in a second side of the metal core, the second side opposite the first side. In another embodiment, the first portion and the second portion each comprise at least twenty percent of the metal core by volume.

Techniques and architectures to mitigate heating of circuitry are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A circuit board comprising: a metal core including: a first metal portion comprising at least five percent of the metal core by volume, wherein a first surface of the first portion is at a first height along a first line of direction; and a second metal portion comprising at least five percent of the metal core by volume, wherein a second surface of the second portion is at a second height along the first line of direction, wherein a difference between the first height and the second height is less than, and at least twenty percent of, an overall thickness of the metal core; and a trench portion disposed between the first and second portions; and a plurality of conductive traces formed on an insulator material disposed on the metal core; a first recess formed on the first surface, and a second recess formed on an opposite side of the second surface.

2. The circuit board of claim 1, wherein a first periphery of the first portion has a first average thickness along the first line of direction, wherein a second periphery of the second portion has a second average thickness along the first line of direction, wherein the first average thickness is at least two times the second average thickness.

3. The circuit board of claim 2, wherein, for any point along the first periphery, a thickness of the first portion through the point is within ten percent of the first average thickness.

4. The circuit board of claim 1, wherein an average thickness of all of the first portion is at least two times an average thickness of all of the second portion.

* * * * *